United States Patent [19]
Alfke

[11] Patent Number: 6,002,282
[45] Date of Patent: Dec. 14, 1999

[54] FEEDBACK APPARATUS FOR ADJUSTING CLOCK DELAY

[75] Inventor: Peter H. Alfke, Los Altos Hills, Calif.

[73] Assignee: Xilinx, Inc., San Jose, Calif.

[21] Appl. No.: 08/771,340

[22] Filed: Dec. 16, 1996

[51] Int. Cl.$^6$ .............................. H03K 5/13; H03K 17/28
[52] U.S. Cl. ......................... 327/165; 327/149; 327/158; 375/359
[58] Field of Search ................................ 327/3, 5, 7, 12, 327/161, 146–148, 149, 153, 155–158, 234, 236, 243, 244, 250, 251, 276–278, 141, 165; 375/355, 359; 326/93, 94

[56] References Cited

U.S. PATENT DOCUMENTS

| | | | |
|---|---|---|---|
| 4,316,150 | 2/1982 | Crosby | 327/236 |
| 4,637,018 | 1/1987 | Flora et al. | 371/1 |
| 4,682,116 | 7/1987 | Wolaver et al. | 327/5 |
| 5,101,117 | 3/1992 | Johnson et al. | 327/244 |
| 5,164,677 | 11/1992 | Hawkins et al. | 327/158 |
| 5,216,302 | 6/1993 | Tanizawa | 327/158 |
| 5,223,755 | 6/1993 | Richley | 327/158 |
| 5,266,851 | 11/1993 | Nukui | 327/12 |
| 5,455,540 | 10/1995 | Williams | 327/12 |
| 5,486,783 | 1/1996 | Baumert et al. | 327/149 |
| 5,514,990 | 5/1996 | Mukaine et al. | 327/122 |
| 5,670,903 | 9/1997 | Mizuno | 327/158 |

OTHER PUBLICATIONS

Xilinx, Inc., "The Programmable Logic Data Book," Sep. 1996, pp. 13–45, available from Xilinx, Inc., 2100 Logic Drive, San Jose, California 95124.

Primary Examiner—Timothy P. Callahan
Assistant Examiner—Eunja Shin
Attorney, Agent, or Firm—E. Eric Hoffman, Esq; Edel M. Young

[57] ABSTRACT

A closed loop clock delay adjustment system measures the drift between the delay introduced by clock buffers and by delays inserted at the device data input pins. The system uses a reference delay at the input of a measurement flip-flop. The reference delay is defined to be an approximate average of the delays at the data input pins. An external clock signal is coupled to the input of the reference delay. The output of the reference delay is coupled to the data input of the measurement flip-flop. The external clock signal is also coupled to the input of a variable clock delay buffer sub-circuit. The output of the variable clock delay buffer is coupled to the clock signal input of the measurement flip-flop. In operation, the measurement flip-flop compares the variable clock delay buffer output signal with the clock signal delayed by the reference delay. If the variable clock delay buffer output signal is delayed more than the reference delay output signal, the variable clock delay is decreased. If the variable clock delay buffer output signal is delayed less than the reference delay output signal, the variable clock delay is increased. The input of an up-down counter is coupled to the measurement flip-flop output. The digital output of the up-down counter is converted to an analog signal which then controls the variable clock delay buffer. This closed loop clock delay adjustment system maintains the clock delay within a small range of a predetermined optimal value.

17 Claims, 7 Drawing Sheets

9 ns clock delay 11 ns clock delay

FEEDBACK APPARATUS FOR ADJUSTING CLOCK DELAY

FIELD OF THE INVENTION

The invention relates to the field of digital logic, more specifically to synchronization of clock signals and data signals applied to external pins of a chip.

BACKGROUND OF THE INVENTION

Digital circuit devices typically include flip-flops, latches, or other storage circuits controlled by a clock signal. These devices receive both a data signal and a clock signal. In order to properly store a data signal, the data signal must be present on the data input terminal close to or during the active clock transition.

Within an IC device, the proper timing can be reliably achieved by carefully designing the clock distribution network. If the worst case clock skew (time spread over which a clock edge arrives at the various flip-flops on the chip) is less than the sum of the clock-to-output delay (time from when a clock edge is applied to the clock terminal of a flip-flop and the data appear on the flip-flop output terminal) plus the minimum interconnect delay, there is never a problem that a data signal will be removed from a flip-flop input terminal before the clock signal has caused the data to be captured.

However, signals applied from external sources to pins of the IC device must be carefully timed so that the IC device will respond correctly. Practically, a time window during which valid data must be present on the data input terminal is specified in order to guarantee predictable performance over the full range of operating conditions and manufacturing tolerances. This time window is discussed at page 13–45 of "The Programmable Logic Data Book" published in September, 1996 by Xilinx, Inc., 2100 Logic Drive, San Jose, Calif. 95124, assignee of the present invention.

This time window often extends on both sides of a clock edge. The time before the clock edge during which data are required to be present and stable is called "set-up time" and the time after the clock edge during which data are required to be present and stable is called "hold time". Since data applied from an external pin to a flip-flop data input terminal will stabilize at the data source some time after a certain clock edge (clock-to-out time), and data must be available at the flip-flop data input terminal before the next clock edge (set-up time), the maximum clock frequency is limited by the sum of clock-to-out time and set-up time; therefore, it is desirable that set-up time be as short as possible.

An on-chip clock signal is often distributed globally from a single input pin to an entire chip or a large part of a chip. In large integrated circuit devices having global clock signals there is a clock distribution delay, which is the time difference between when a global clock signal is applied to the external pin and when the global clock signal arrives at a last point in the IC device. Thus, it is necessary to account for the clock distribution delay.

Large clock distribution delay can create large hold time requirements for signals going to points distant from the clock source (the time an externally applied data signal is required to remain stable after an externally applied clock edge appears), since data must be present at the data input terminal of a particular flip-flop when the clock signal switches at the clock input terminal of that flip-flop. Failing to meet a hold time requirement can cause data errors, and in particular can cause a race condition. A race condition occurs when a data source is not guaranteed to maintain a first data signal beyond a time when a clock edge arrives at a flip-flop receiving the data signal. Erroneously, the flip-flop may receive a second data signal and miss the first data signal. This race condition is usually a fatal system error. Therefore, chips are usually designed not to have hold time requirements.

Xilinx, Inc., assignee of the present invention, has addressed the clock distribution delay and potential hold-time problems by adding a deliberate delay to every data input signal coming from an external pin. In some FPGAs, this added delay is fixed and always present; in other FPGAs, the delay is optional, and its value is tailored to the clock distribution delay; generally, delay is larger for larger devices since larger devices tend to have larger clock distribution delay. As a result of this added delay, no Xilinx FPGA has a hold time requirement, but the set-up time is significant. Since the longest set-up time limits the operating speed or maximum clock rate of a system, it is desirable to minimize the set-up time, but without requiring a hold time.

SUMMARY OF THE INVENTION

One prior art clock distribution delay compensation approach is to use the worst case clock distribution delay and add a fixed artificial delay to each input of the device. This is an open loop approach. By contrast, the present invention provides a closed loop adaptive system which measures the drift, and changes the clock distribution delay as needed based on real time measurements of the clock distribution delay.

The closed loop clock delay adjustment system measures the difference between the delay introduced by on-chip clock buffers and delays inserted at the device data input pins. By measuring the actual real time difference, a sub-circuit can adjust the clock buffer delay to optimize the total clock delay introduced, rather than requiring data delays and clock buffer delays to be matched over the full range of worst case drift and process variation. This reduces the set-up time requirement without introducing a hold-time requirement, One embodiment uses a reference delay circuit at the input of a measurement flip-flop. The reference delay of this circuit is chosen to be equal to the delays at the data input pins, assuming all delays are equal. The external clock signal is coupled to the input of the reference delay circuit. The output of the reference delay circuit is coupled to the data input of the measurement flip-flop. The external clock signal is also coupled to the input of a variable clock delay buffer sub-circuit. The output of the variable clock delay buffer is coupled to the clock signal inputs of the measurement flip-flop and the other data input flip-flops.

In operation, the measurement flip-flop compares the variable clock delay buffer output signal with the clock signal delayed by the reference delay circuit. If the variable clock delay buffer output signal is delayed more than the reference delay output signal, then the variable clock delay is decreased. If the variable dock delay buffer output signal is delayed less than the reference delay output signal, then the variable clock delay is increased.

A variety of circuits can be used to control the variable clock delay. In one embodiment, the input of an up-down counter is coupled to the measurement flip-flop output. The digital output of the up-down counter is converted to an analog signal which then controls the variable clock delay buffer. This closed loop clock delay adjustment system maintains the clock delay within a small range of a predetermined optimal value. In another embodiment there are two reference delay circuits, one having a delay slightly more than that of the data input delays and another having a delay slightly less than that of the data input delays. A counter changes its output value only when the variable delay is not between the two reference delays.

DETAILED DESCRIPTION OF THE INVENTION

The present invention is directed to a method and apparatus for a closed-loop clock delay adjustment system. In one embodiment, the system measures the drift between the delay introduced by on-chip clock buffers and by delays inserted at the device data input pins. By measuring the actual real time drift, the clock buffer delay can be adjusted to minimize the input set-up time, without risking an input hold-time requirement.

The closed loop clock delay adjustment system of the present invention overcomes the drawbacks of Phase-Locked Loop (PLL) clock regeneration systems. The present invention is clock frequency independent in that the components can easily be made to operate at any clock frequency as high as the other standard components on the device. Also, the present invention system is fully functional with a variable-frequency or intermittent clock signal. The accuracy of the present invention is also typically greater than the accuracy of PLL systems because the present invention is a closed-loop regulator that includes the input delay circuit.

1. Two Flip-flop Up-down Counter Embodiment

Figure 1:
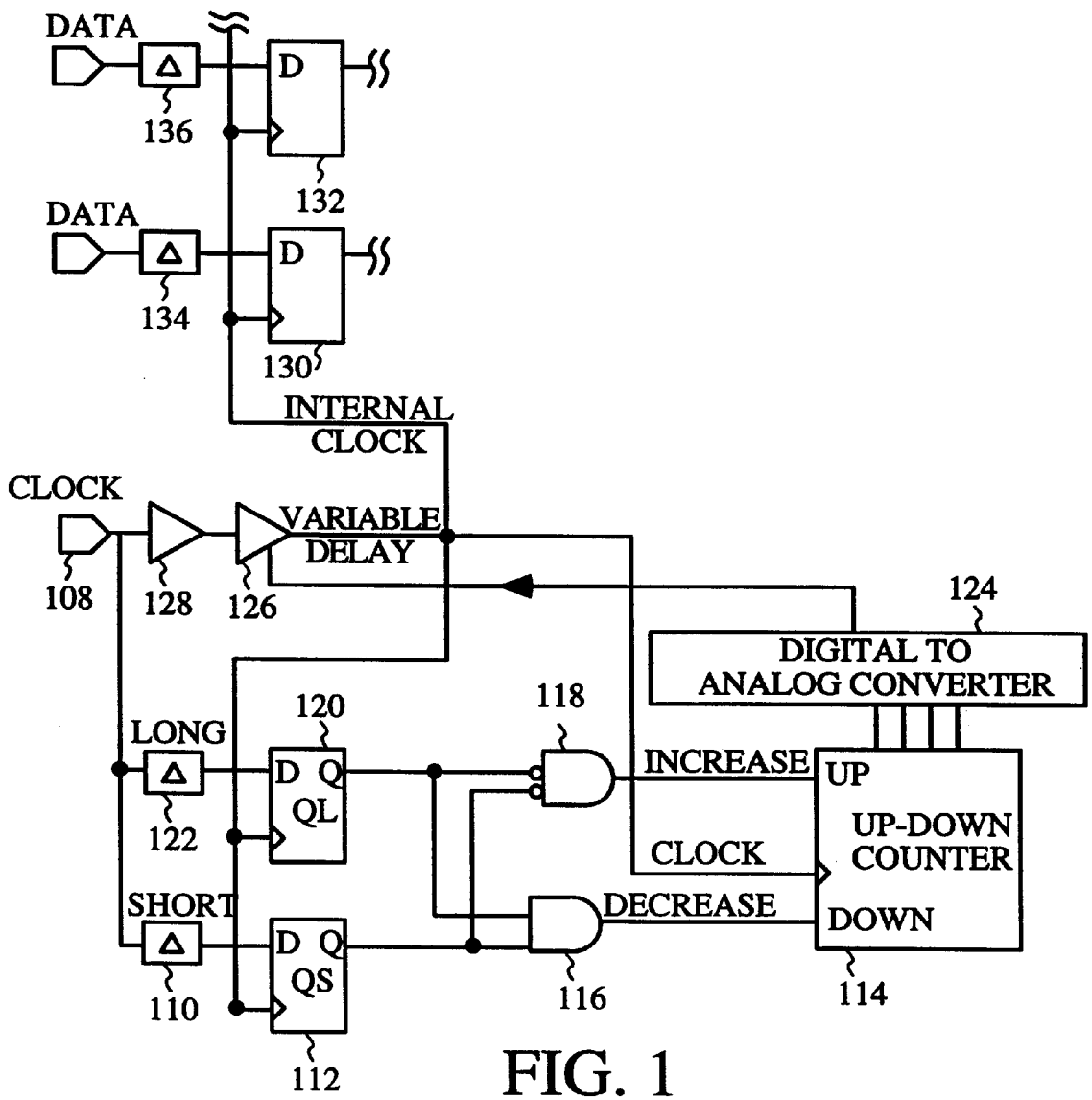
FIG. 1 illustrates a two-flip-flop, up-down counter embodiment of the present invention.

FIG. 1 illustrates a two flip-flop, up-down counter embodiment of the present invention closed loop adjustable clock delay system. The circuit of FIG. 1 is typically implemented as a small subsection of a larger digital device (not shown), such as a field programmable gate array. In FIG. 1, clock pad 108 is coupled to the input of long delay 122 and short delay 110. The output of long delay 122 is coupled to the data input of flip-flop 120. The output of short delay 110 is coupled to the data input of flip-flop 112. Clock pad 108 is further coupled to the input of buffer 128. The output of buffer 128 is coupled to the input of variable delay buffer 126. The output of variable delay buffer 126 is coupled to the clock inputs of flip-flops 112, 120, 130 and 132. Variable delay buffer 126 is controlled by a feedback signal. A variety of techniques may be used for the control of variable delay buffer 126, including for example, charging a capacitor, as is known by those of ordinary skill in the art.

The inputs of delays 134 and 136 are driven by data input pads. The output of delay 136 is coupled to the data input of flip-flop 132. The output of delay 134 is coupled to the data input of flip-flop 130. The output of flip-flop 120 is coupled to a first input of AND gate 116 and to a first inverted input terminal of AND gate 118. The output of flip-flop 112 is coupled to a second inverted input of AND gate 118 as well as a second input of AND gate 116. The output of AND gate 116 is coupled to the "down" input of up-down counter 114. The output of AND gate 118 is coupled to the "up" input of up-down counter 114. A shift register with associated input and output interface logic can also be used instead of up-down counter 114. The four (or more) outputs of up-down counter 114 are coupled to the digital inputs of digital-to-analog converter 124. The analog output of digital-to-analog converter 124 is coupled to the control line of variable delay buffer 126.

In one embodiment, flip-flops 120 and 112 are D (data) type flip-flops. D flip-flops have one data input and one clock input. The data input is sampled during the active clock edge and if the data input is logic 1, the flip-flop goes to the 1 state. If the data input is 0, a clock edge changes the state of the flip-flop to 0.

In one embodiment, the long delay 122 is defined to exceed the required delay of any of the flip-flops such as 130 and 132 in the device. A typical logic device may have a D flip-flop on each of its data inputs. This series of D flip-flops is represented by D flip-flops 130 and 132. Each D flip-flop typically has an artificial delay, added to its data input, as illustrated by delays 134 and 136. These delays often comprise a simple resistor-capacitor delay. A series of buffers or inverters as well as other types of delays may also be used, as is well known by those of ordinary skill in the art. Ideally, the values of all delays are identical; however, the actual values of the delays vary over a range defined by the process parameters of the method of fabrication, and by ambient conditions like temperature and supply voltage. The proportional relationship between delays of the same type of component fabricated in different locations on a device is called tracking. The tracking accuracy of like elements is typically much better than the variation range for the absolute value from one IC device to the next. Here the tracking accuracy is assumed to be sufficient that delay differences between delay elements such as 134 and 136 can be ignored.

In operation, clock signals enter the system at clock pad 108. The clock signals are coupled through long delay 122 into the long-delay flip-flop 120. The clock signals from clock pad 108 are also routed through clock buffer 128 to variable delay clock buffer 126. Clock buffers 126 and 128 increase the clock signal drive strength to reduce the clock skew to within an acceptable range. The delayed clock signal is routed from buffer 126 to the clock inputs of the D flip-flops including 120 and 112. Flip-flops 120 and 112 compare the delay introduced by the delay elements 126 and 128. the delay introduced by buffers 126 and 128. Variations in temperature and other operating conditions might affect the timing of the delay elements differently than the timing of the active component buffers. Hence, the delays introduced by the delay elements 110 and 122 generally drift with respect to the buffer delays, but the ratio of delays 122 and 110 to the delays 134 and 136 stays fairly constant.

Flip-flops 120 and 112 control up-down counter 114. Up-down counter 114 provides, the digital output value to digital-to-analog converter 124 and increments the value in response to each clock signal when the up input is high. Similarly, up-down counter 114 decrements the digital output value in response to each clock signal when the down input is high. The resolution of the up-down, counter digital output and the digital-to-analog converter should be sufficient to control the clock delay to within the desired accuracy, for example, to within 0.5 ns.

Figure 5A:
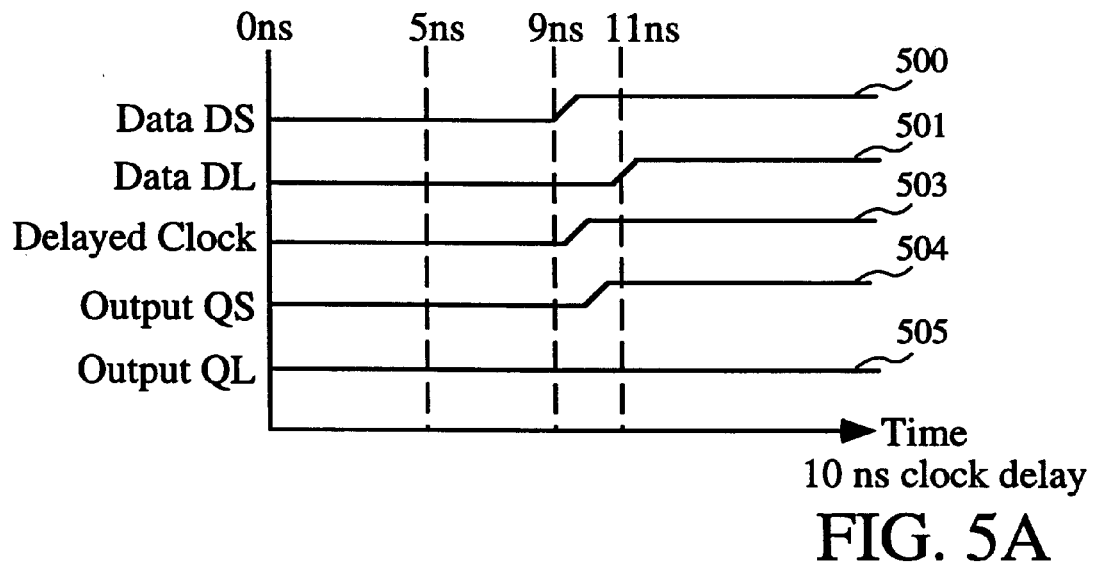
FIGS. 5A is a timing diagram illustrating the operation of a two flip-flop embodiment of the present invention.
Figure 5B:
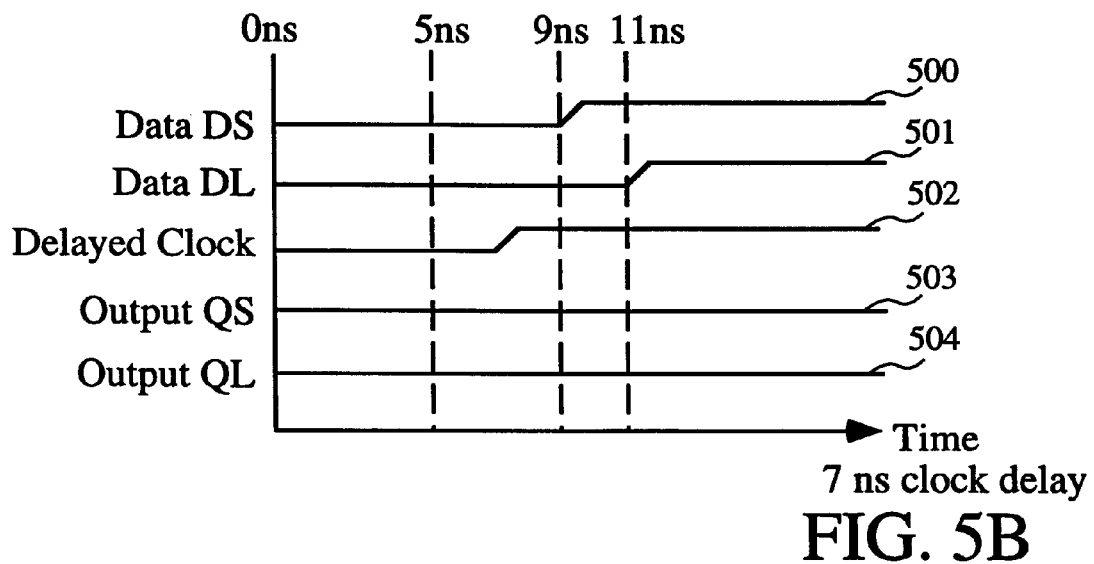
FIGS. 5B is a timing diagram illustrating the operation of a two-flip-flop embodiment of the present invention.
Figure 5C:
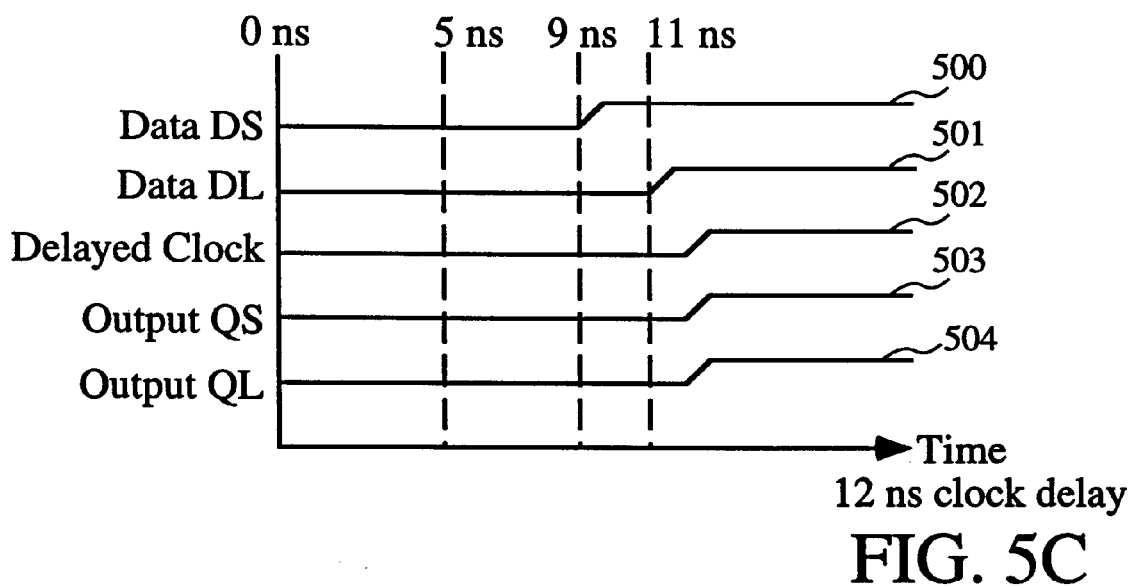
FIGS. 5C is a timing diagram illustrating the operation of a two-flip-flop embodiment of the present invention.

The operation of flip-flops 120 and 112 is illustrated in FIGS. 5A, 5B and 5C. FIGS. 5A, 5B and 5C illustrate a rising edge clock triggered system, which means that the data present at the flip-flop data input at the time of the rising clock edge is the data that determines the output state of the flip-flop for that clock cycle, although set-up and hold time requirements can further restrict this definition. The closed loop clock delay adjustment system of the present invention can also be implemented in a falling-edge-triggered embodiment. The signals of FIGS. 5A, 5B and 5C correspond to a system operating at approximately 50 MHz. The clock period is thus about 20 ns. There is variation in clock distribution delay due to processing variation, operating temperature variation, and supply voltage variation. A 50 MHz system may have an acceptable clock distribution delay range of, for example, 5 ns. Generally the acceptable clock distribution delay range decreases as the clock frequency increases. For example, a 100 MHz system may have an acceptable clock distribution delay range of 3 ns. FIG. 5A illustrates a clock distribution delay within the acceptable range defined by long delay 122 and short delay 110. Signal 500 represents the data signal received at the data input of flip-flop 112. Signal 501 represents the data signal input at flip-flop 120. The delayed clock signal is the signal received at the clock inputs of flip-flop 120 and flip-flop 112. In FIG. 5A, at the time the delayed clock signal goes high the data signal 500 is high and the data signal 501 is low. Therefore, the output of flip-flop 112 goes high at the rising edge of the clock signal and the output of flip-flop 120 remains low.

As illustrated in FIG. 1 the output of flip-flop 120 is coupled to an inverted input of AND gate 118 and an input of AND gate 116. The output of flip-flop 112 is also coupled to an inverted input of AND gate 118 and an input of AND gate 116. Therefore, with the data signal 500 high and data signal 501 low at the rising clock edge, as shown in FIG. 5A, AND gate 118 and AND gate 116 both output a low signal. The low input signals at the up and down inputs of up-down counter 114 maintain the variable delay control of buffer 126 at a constant value because the clock distribution delay is within the acceptable clock delay range as defined by long delay 122 and short delay 110. In FIG. 5A, the acceptable clock delay range is between approximately 9 ns and 11 ns.

FIG. 5B illustrates an example where the clock delay is shorter than the minimum value of the acceptable range. In FIG. 5B, the delayed clock signal goes high before the data signal has arrived at the data input of either flip-flop 120 or 112. As a result the outputs of flip-flops 120 and 112 are both low. The inverted inputs of AND gate 118 produce a high level signal at the up input of up-down counter 114, which increments the digital output to digital-to-analog converter 124, and ultimately increases the variable delay of buffer 126.

FIG. 5C illustrates an example where the clock delay is longer than the maximum limit of the acceptable range. In FIG. 5C, at the time of the rising clock edge, both data signals 500 and 501 are high. As a result, the outputs of both flip-flop 112 and 120 are high. This causes AND gate 116 to output a high signal, which decrements up-down counter 114. Digital-to-analog converter 124 then reduces, the variable delay of buffer 126.

One of the operating principles of the embodiment of FIG. 1 is that similar components on a device respond to changes in operating conditions in similar ways. More specifically, because the same type of delay is used at the input of the measurement flip-flops 120 and 112 as at the inputs of the data flip-flops including 130 and 132, the variations in measurement delays 110 and 122 will track the variations in data delays 134 and 136 over changes in, for example, temperature and supply voltage. This is true even though variations in operating conditions introduce a greater drift between measurement delays 110 and 122 and the clock distribution delay created in part by buffers 126 and 128, since buffers 126 and 128 may be, for example, active components, and delays 110 and 122 may be, for example, passive resistor-capacitor type delays.

As illustrated in FIGS. 5A, 5B and 5C the upper limit on the acceptable clock delay is defined with respect to the rising edge of the long delay data pulse signal 500. The lower limit of the acceptable clock delay is determined with respect to the rising edge of the short delay data pulse signal 501, plus any set-up time that may be required. The resulting clock delay range is within the worst case process variation delay range. For example, the long delay may be 11 ns and the short delay 9 ns. In this embodiment, clock pulses reach the flip-flop 120 data input 2 ns later than the corresponding clock pulses reach the flip-flop 112 data input.

2. Two Flip-flop Anolog Delay Adjustment Embodiment

Figure 2:
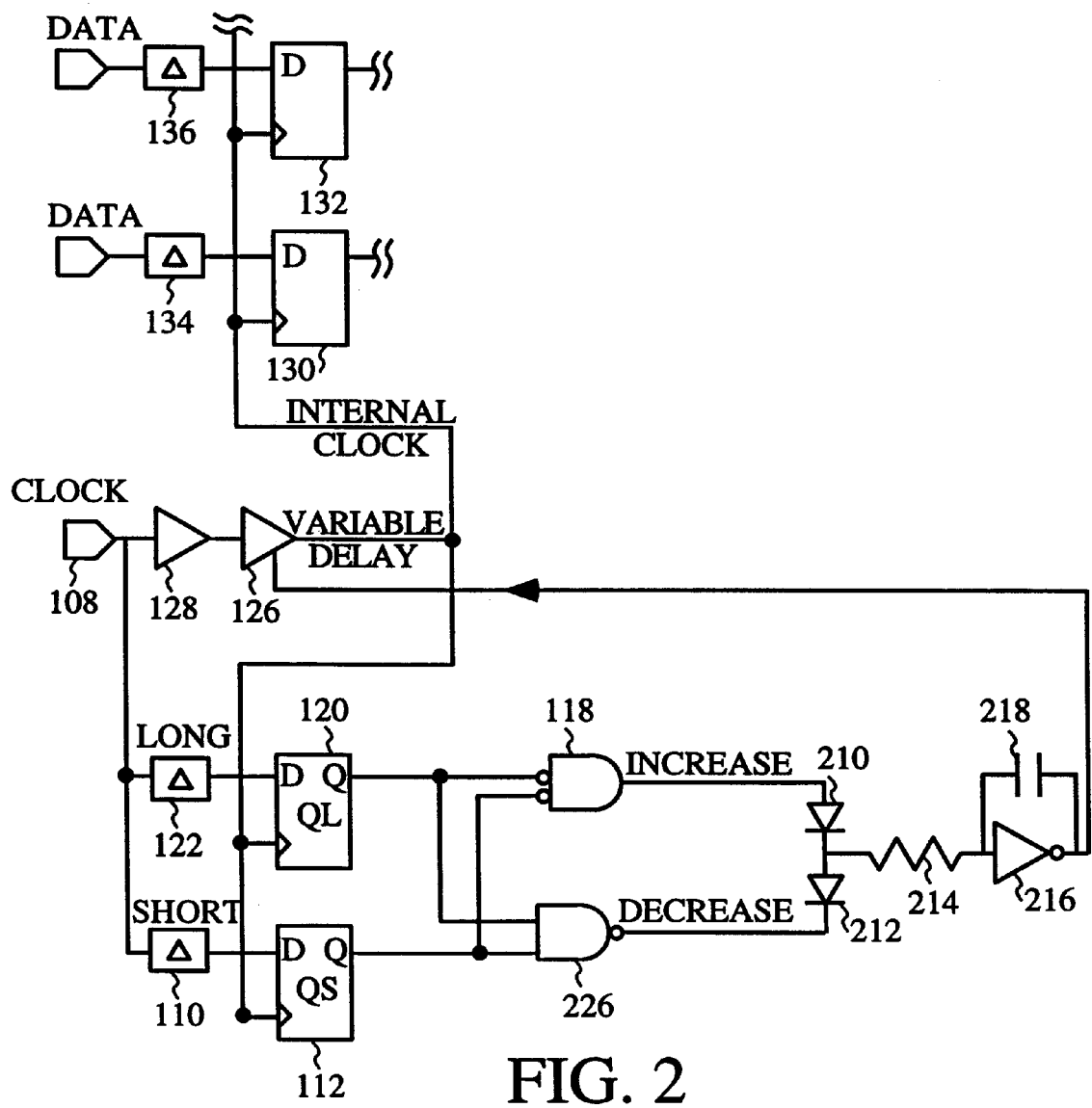
FIG. 2 illustrates a two-flip-flop, analog delay correction embodiment of the present invention.

FIG. 2 illustrates a two flip-flop analog delay correction embodiment of the present invention. The analog delay embodiment of FIG. 2 is similar to the digital up-down counter embodiment of FIG. 1 with up-down counter 114 and digital-to-analog counter 124 replaced by operational amplifier 216. Elements 1083, 110, 112, 118, 120, 122, 126, 128, 130, 132, 134 and 136 are as described for FIG. 1. AND gate 116 of FIG. 1 is replaced by NAND gate 226 in FIG. 2. In this embodiment the duration of the variable delay of element 126 is inversely related to the control voltage.

The output of AND gate 118 is coupled to the input of diode 210. The output of diode 210 is coupled to a first terminal of resistor 214 and the input of diode 212. The output of diode 212 is coupled to the output of NAND gate 226. Resistor 214, capacitor 218, and operational amplifier 216 are configured as an integrator. The second terminal of resistor 214 is coupled to the input of operational amplifier 216. The input of operational amplifier 216 is also coupled to a first terminal of capacitor 218. The output of operational amplifier 216 is coupled to the second terminal of capacitor 218 as well as to the control line of variable delay buffer 126.

In operation, the functionality of flip-flops 112 and 120 as illustrated in FIGS. 5A, 5B and 5C also applies to the embodiment of FIG. 2. For the 10 ns clock distribution delay of FIG. 5A, at the time of the rising edge of the delayed clock data signal 500 is high and data signal 501 is low. This causes flip-flop 112 to produce a high output signal and flip-flop 120 to produce a low output signal. One input of AND gate 118 is high and the other is low, which causes AND gate 118 to produce a low signal. One input of NAND gate 226 is low and the other input is high, thus the output is high. Where the voltage at the diode side of resistor 214 is between a digital low and digital high signal level, both diodes 210 and 212 are reverse biased and no current flows in resistor 214, and the voltage at the output of 216 is held constant. There is thus no change in the variable delay control line output of amplifier 216 because the clock delay is within the acceptable range defined by long delay 122 and short delay 110.

For the 7 ns clock delay illustrated in FIG. 5B, at the time of the rising edge of the delayed clock signal both data signals 500 and 501 are low, which comprise the inputs at the data inputs of flip-flops 112 and 120 respectively. This indicates that the clock distribution delay is too short. The low input signals at flip-flops 112 and 120 produce low outputs. The low flip-flop outputs cause the inverted inputs at AND gate 118 to produce a high output, and the two low inputs at NAND gate 226 causes the inverted output to produce a high output. The high output of AND gate 118 forward biases diode 210 and causes current to flow in resistor 214, which causes the output of amplifier 216 to go to a lower voltage. This decreases the variable delay control line voltage, which increases the clock distribution delay of buffer 126.

For the 12 ns clock distribution delay illustrated in FIG. 5C, at the time of the delayed clock rising edge both data signals 500 and 501 are high. This causes the outputs of flip-flops 112 and 120 to be high at the rising clock edge. These two high level signals are inverted at the inputs of AND gate 118 to produce a low level output signal. The two high level outputs also produce a low level output signal at the output of NAND gate 226. This forward biases diode 212 and causes current to flow in 214 which causes the output of 216 to go to a higher voltage. This increases the variable delay control voltage and thus reduces the variable delay.

3. Single Flip-flop Up-down Counter Embodiment

Figure 3:
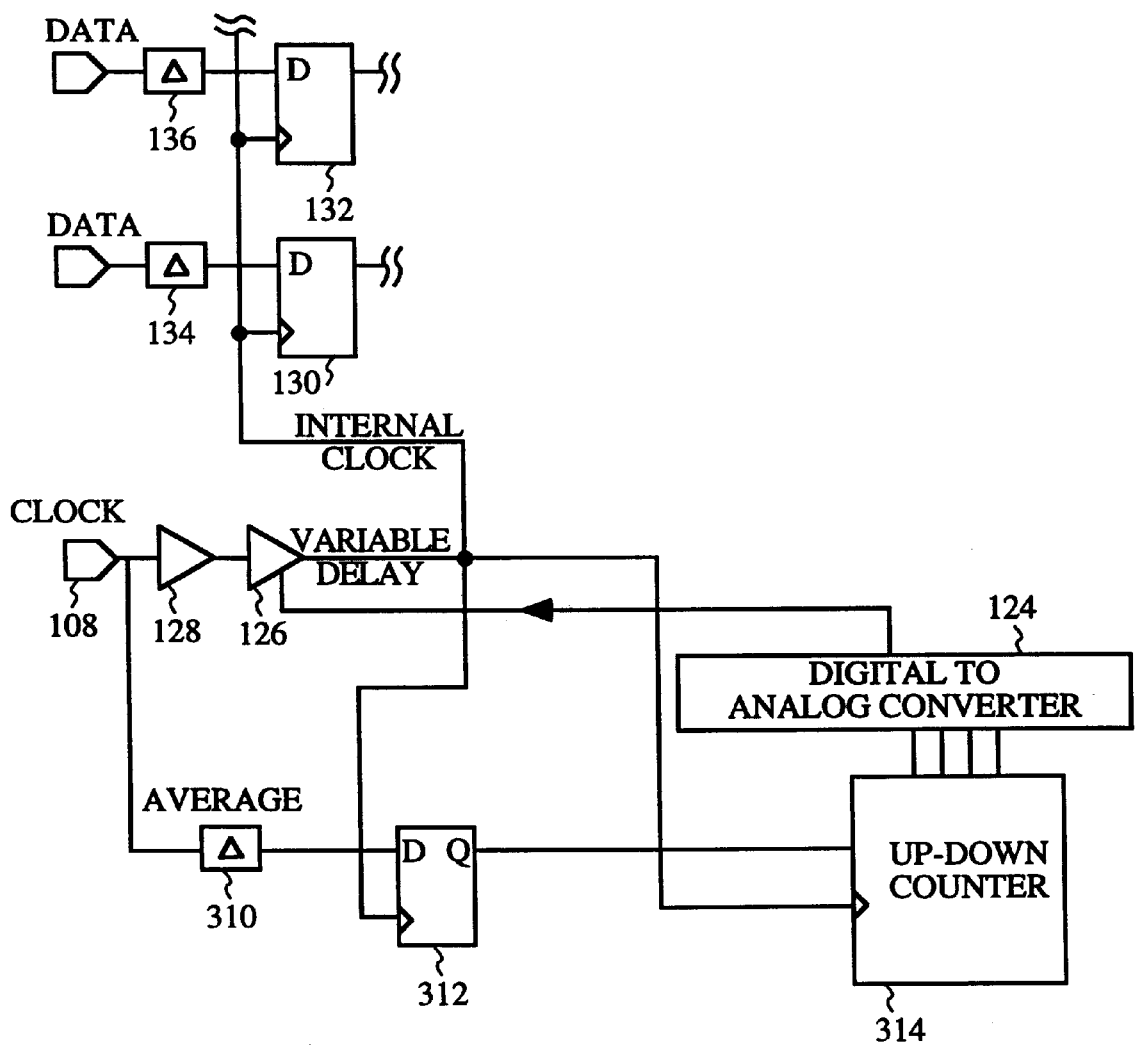
FIG. 3 illustrates a single-flip-flop, up-down counter embodiment of the present invention.

FIG. 3 illustrates a single flip-flop embodiment of the present invention. The single flip-flop embodiment of FIG. 3 is similar to the two flip-flop embodiment of FIG. 1 with the replacement of flip-flops 120 and 112 as well as the associated delay elements 110 and 122 by a single flip-flop 312 and a single delay 310. In the embodiment of FIG. 3, clock pad 108 is coupled to the input of average delay 310. The output of average delay 310 is coupled to the data input of flip-flop 312. As before, variable delay buffer 126 generates the internal clock signal, which drives the clock inputs of flip-flop 312, up-down counter 314 and flip-flops of the device such as 130 and 132. The output of flip-flop 312 is coupled to the input of up-down counter 314. A shift register with associated input and output interface logic can also be used instead of up-down counter 314. The outputs (four, in this case) of up-down counter 314 are coupled to the digital inputs of digital-to-analog converter 124. The analog output of digital-to-analog converter 124 is coupled to the control line of variable delay buffer 126. Elements 126, 128, 130, 132, 134 and 136 are otherwise as described in FIG. 1.

Delay element 310 is manufactured under the same fabrication conditions as the other delay elements, including 134 and 136. Therefore, element 310 can be reliably expected to have the same delay as other delay elements such as 134 and 136. Alternatively the delay of element 310 can be defined to be any value within the acceptable clock distribution delay range within which the device can function as desired. In contrast to up-down counter 114, included in FIG. 1, up-down counter 314 only has one input. A high input signal to up-down counter 314 decrements the output to digital-to-analog converter 124. A low input signal to up-down counter 314 increments the output.

Figure 6A:
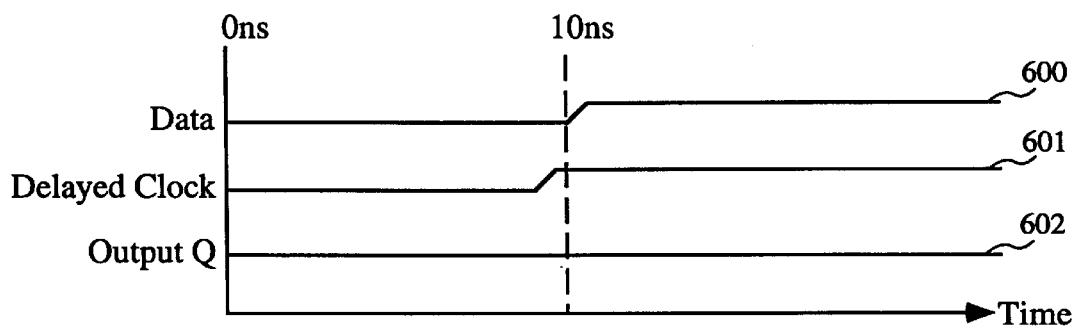
FIG. 6A is a timing diagram illustrating the operation of a single-flip-flop embodiment of the present invention.

In operation, in contrast to the embodiments with two flip-flops, the clock delay is adjusted every cycle. Flip-flop 312 signals up-down counter 314 to increase or decrease the clock delay each time flip-flop 312 receives a clock pulse. For example, in FIGS. 6A and 6B, average delay 310 has a value of 10 ns. In FIG. 6A, the clock distribution delay is about 9 ns. The D input of flip-flop 312 data input signal 600 is therefore low at the rising edge of the delayed clock signal 601 which sets the Q output signal 602 to a low level. The low level input signal at up-clown counter 314 increments the output to digital-to-analog converter 124. Digital-to-analog converter 124 then increases the variable delay control voltage, which increases the clock delay.

Figure 6B:
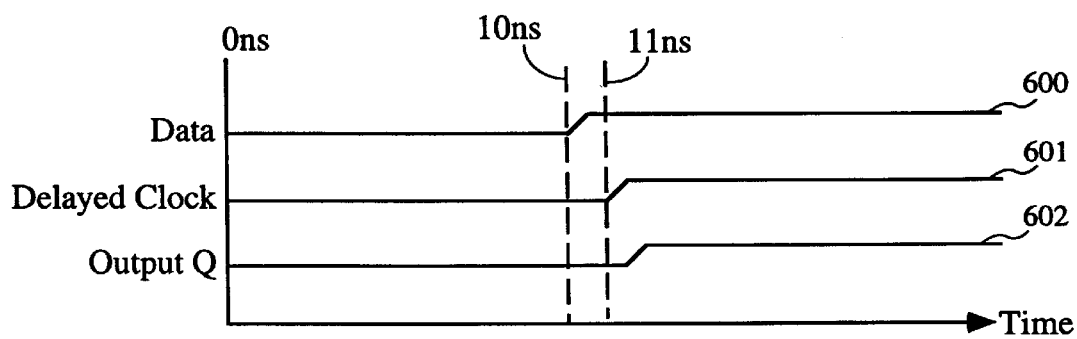
FIG. 6B is a timing diagram illustrating the operation of a single-flip-flop embodiment of the present invention.

In FIG. 6B the clock delay is 11 ns. At the time of the rising clock edge the data input signal 600 to flip-flop 312 is high; therefore the flip-flop 312 output goes high. The high signal at the input of up-down counter 314 decreases the digital output to digital-to-analog converter 124. Digital-to-analog converter 124 then reduces the variable delay control voltage, which reduces the clock delay.

At each clock cycle flip-flop 312 increments or decrements up-down counter 314. Where the rate of clock drift between the clock signal buffers 126 and 128 and average delay 310 is slow relative to the clock frequency, the single flip-flop clock delay system maintains the clock delay to within the resolution of the digital-to-analog converter 124 and up-down counter 314. The single flip-flop embodiment of FIG. 3 can, in some cases, therefore maintain the clock delay within a narrower range than the two flip-flop embodiment of FIG. 1.

4. Single Flip-flop Anolog Delay Adjustment Embodiment

Figure 4:
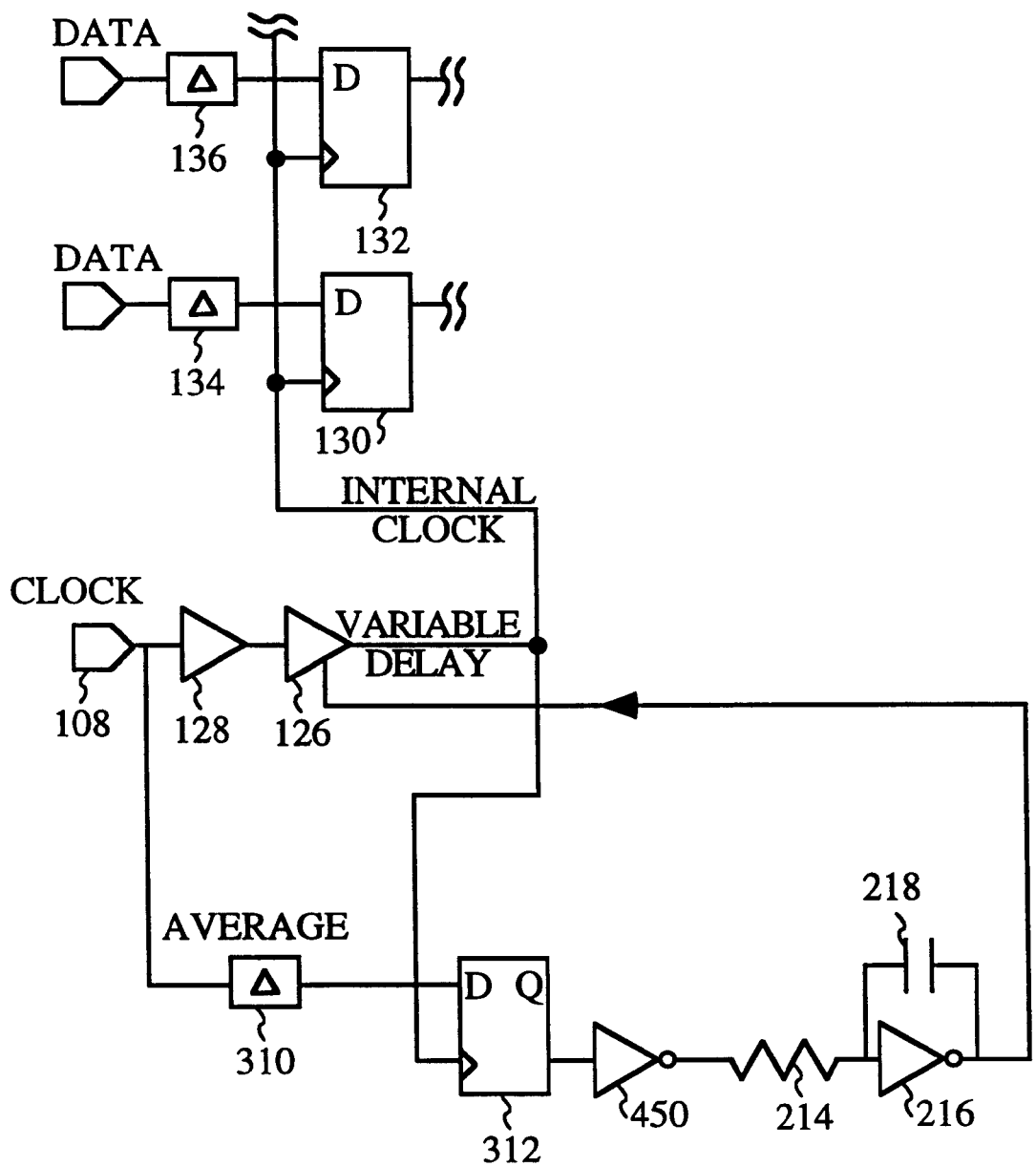
FIG. 4 illustrates a single-flip-flop, analog delay correction embodiment of the present invention.

FIG. 4 illustrates a single flip-flop, analog delay correction embodiment of the present invention. The analog delay embodiment of FIG. 4 is similar to the digital up-down counter embodiment of FIG. 3 with up-down counter 314 replaced by operational amplifier 216. Elements 108, 126, 130, 132, 134, 136, 310 and 312 are as described in FIG. 3. The input of inverter 450 is coupled to the output of flip-flop 312. The output of inverter 450 is coupled to the input of resistor 214. Resistor 214, amplifier 216, and capacitor 218 are otherwise as described in FIG. 2.

In operation, the functionality of the average delay 310 and flip-flop 312 is as described in regard to FIG. 3. The operation of the integrator circuit comprising resistor 214, amplifier 216, and capacitor 218 is as described in regard to FIG. 2. The inverter 450 defines the proper polarity for the feedback control. For example, as in FIG. 6A when the clock distribution delay is less than the value of average delay 310, the data input to flip-flop 312 is low at the rising edge of the delayed clock signal 610 and the output of flip-flop 312 is low. The output of inverter 450 is therefore high which decreases the output of inverting amplifier 216 which then decreases the variable delay control voltage and increases the duration of the variable delay.

Thus a method and apparatus for a closed loop clock delay adjustment system have been described. Although the present invention has been described with respect to: certain specific embodiments, it will be clear to those skilled in the art that the inventive features of the present invention are applicable to other embodiments, as well, all of which are intended to fall within the scope of the present invention.

I claims:

1. An integrated circuit comprising:
   a plurality of data input pads for receiving a corresponding plurality of data input signals;
   a plurality of data delay circuits, each being coupled to a corresponding one of the data input pads, and each being designed to introduce a first signal delay to a corresponding one of the data input signals;
   a plurality of data flip-flops, each being coupled to a corresponding one of the data delay circuits,
   a clock input pad for receiving a clock signal;
   a reference delay circuit coupled to the clock input pad, the reference delay circuit being designed to introduce the first signal delay to the clock signal, thereby creating a first delayed clock signal;
   a variable delay circuit coupled to the clock input pad, the variable delay circuit being designed to introduce a variable signal delay to the clock signal, thereby creating a second delayed clock signal, the variable delay circuit being coupled to the data flip-flops, wherein the second delayed clock signal is used to clock the data input signals into the data flip-flops; and a control circuit coupled to the reference delay circuit and the variable delay circuit, the control circuit generating a control signal in response to the first and second delayed clock signals, the control signal being applied to the variable delay circuit, thereby adjusting the variable signal delay toward the first signal delay.

2. The integrated circuit of claim 1 wherein said control circuit comprises:

a flip-flop having a data input terminal coupled to receive the first delayed clock signal, a clock input terminal coupled to receive the second delayed clock signal, and an output terminal; and a conversion circuit coupled to the output terminal of the flip-flop, wherein the conversion circuit generates the control signal in response to a signal provided on the output terminal of the flip-flop.

3. The integrated circuit of claim 2 wherein said conversion circuit comprises:

a counter having an input terminal and a plurality of output terminals, the input terminal of said counter being coupled to the output terminal of said flip-flop; and a digital-to-analog converter having a plurality of input terminals coupled to the output terminals of said counter and an output terminal coupled to provide the control signal to said variable delay circuit.

4. The integrated circuit of claim 2 wherein said conversion circuit comprises:

a resistor having a first terminal coupled to the output terminal of said flip-flop;

an amplifier having an input terminal and an output terminal, said input terminal of said amplifier coupled to a second terminal of said resistor, said output terminal of said amplifier coupled to said variable delay circuit; and a capacitor having a first terminal coupled to the input terminal of said amplifier and a second terminal coupled to the output terminal of said amplifier.

5. An integrated circuit comprising:

a plurality of data input pads for receiving a corresponding plurality of data input signals;

a plurality of data delay circuits, each being coupled to a corresponding one of the data input pads, and each being designed to introduce a first signal delay to a corresponding one of the data input signals;

a plurality of data flip-flops, each being coupled to a corresponding one of the data delay circuits;

a clock input pad for receiving a clock signal;

a first reference delay circuit coupled to the clock input pad, the first reference delay circuit being designed to introduce a second signal delay to the clock signal, the second signal delay being less than the first signal delay, thereby creating a first delayed clock signal;

a second reference delay circuit coupled to the clock input pad, the second reference delay circuit being designed to introduce a third signal delay to the clock signal, the third signal delay being greater than the first signal delay, thereby creating a second delayed clock signal;

a variable delay circuit coupled to the clock input pad, the variable delay circuit being designed to introduce a variable signal delay to the clock signal, thereby creating a third delayed clock signal, the variable delay circuit being coupled to the data flip-flops, wherein the third delayed clock signal is used to clock the data input signals into the data flip-flops; and a control circuit coupled to the first reference delay circuit, the second reference delay circuit and the variable delay circuit, the control circuit generating a control signal in response to the first, second and third delayed clock signals, the control signal being applied to the variable delay circuit, thereby adjusting the variable signal delay within a range defined by the second and third signal delays.

6. The integrated circuit of claim 5 wherein said control circuit comprises:

a first flip-flop having a data input terminal coupled to receive the first delayed clock signal, a clock input terminal coupled to receive the third delayed clock signal, and an output terminal;

a second flip-flop having a data input terminal coupled to receive the second delayed clock signal, a clock input terminal coupled to receive the third delayed clock signal, and an output terminal;

a first logic gate having a first input terminal coupled to the output terminal of said first flip-flop, and a second input terminal coupled to the output terminal of said second flip-flop;

a second logic gate having a first input terminal coupled to the output terminal of said first flip-flop, and a second input terminal coupled to the output terminal of said second flip-flop;

a counter having a first input terminal coupled to an output terminal of said first logic gate, and a second input terminal coupled to an output terminal of said second logic gate;

a digital-to-analog converter having a plurality of input terminals coupled to a plurality of output terminals of said counter, and an output terminal coupled to said variable delay circuit.

7. The integrated circuit of claim 6 wherein said first and second logic gates comprise AND gates.

8. The integrated circuit of claim 7 wherein said first and second flip-flops are D flip-flops.

9. The integrated circuit of claim 5 wherein said control circuit comprises:

a first flip-flop having a data input terminal coupled to receive the first delayed clock signal, a clock input terminal coupled to receive the third delayed clock signal, and an output terminal;

a second flip-flop having a data input terminal coupled to receive the second delayed clock signal, a clock input terminal coupled to receive the third delayed clock signal, and an output terminal;

a first logic gate having input terminals coupled to the output terminals of the first and second flip-flops;

a second logic gate having input terminals coupled to the output terminals of the first and second flip-flops;

a first diode having an input terminal coupled to an output terminal of said first logic gate;

a second diode having an output terminal coupled to an output terminal of said second logic gate;

a resistor having a first terminal coupled to an output terminal of said first diode and an input terminal of said second diode; and an amplifier having an input terminal coupled to a second terminal of said resistor, and an output terminal coupled to said variable delay circuit;

a capacitor having a first terminal coupled to the input terminal of said amplifier, and a second terminal coupled to said amplifier output terminal.

10. An integrated circuit comprising:

a clock input pad for receiving a clock signal;

a first reference delay circuit coupled to the clock input pad, the first reference delay circuit being designed to introduce a first signal delay to the clock signal, thereby creating a first delayed clock signal;

a second reference delay circuit coupled to the clock input pad, the second reference delay circuit being designed to introduce a second signal delay to the clock signal, the second signal delay being greater than the first signal delay, thereby creating a second delayed clock signal;

a variable delay circuit coupled to the clock input pad, the variable delay circuit being designed to introduce a variable signal delay to the clock signal, thereby creating a third delayed clock signal; and a control circuit coupled to the first reference delay circuit, the second reference delay circuit and the variable delay circuit, the control circuit generating a control signal in response to the first, second and third delayed clock signals, the control signal being applied to the variable delay circuit, thereby adjusting the variable signal delay within a range defined by the first and second signal delays.

11. The integrated circuit of claim 10 wherein said control circuit comprises:

a first flip-flop having a data input terminal coupled to receive the first delayed clock signal, a clock input terminal coupled to receive the third delayed clock signal, and an output terminal;

a second flip-flop having a data input terminal coupled to receive the second delayed clock signal, a clock input terminal coupled to receive the third delayed clock signal, and an output terminal;

a first logic gate having a first input terminal coupled to the output terminal of said first flip-flop, and a second input terminal coupled to the output terminal of said second flip-flop;

a second logic gate having a first input terminal coupled to the output terminal of said first flip-flop, and a second input terminal coupled to the output terminal of said second flip-flop;

a counter having a first input terminal coupled to an output terminal of said first logic gate, and a second input terminal coupled to an output terminal of said second logic gate;

a digital-to-analog converter having a plurality of input terminals coupled to a plurality of output terminals of said counter, and an output terminal coupled to said variable delay circuit.

12. A method of operating an integrated circuit comprising the steps of:

transmitting data input signals from data input pads to corresponding data flip-flops, wherein the data input signals are delayed by a first signal delay;

delaying a clock signal by a second signal delay that is less than the first signal delay, thereby creating a first delayed clock, signal;

delaying the clock signal by a third signal delay that is greater than the first signal delay, thereby creating a second delayed clock signal;

delaying the clock signal by a variable signal delay, thereby creating a third delayed clock signal;

comparing the third delayed clock signal with the first and second delayed clock signals;

increasing the variable signal delay when the third delayed clock signal violates a first predetermined relationship with the first delayed clock signal;

decreasing the variable signal delay when the third delayed clock signal violates a second predetermined relationship with the second delayed clock signal; and using the third delayed clock signal to clock the data input signals into the data flip-flops.

13. The method of claim 12 wherein said step of increasing the variable signal delay comprises increasing the variable signal delay when a rising edge of the third delayed clock signal occurs before a rising edge of the first delayed clock signal.

14. The method of claim 13 wherein the step of decreasing the variable signal delay comprises decreasing the variable signal delay when the rising edge of the third delayed clock signal occurs after a rising edge of the second delayed clock signal.

15. A method of operating an integrated circuit comprising the steps of:

transmitting data input signals from data input pads to corresponding data flip-flops, wherein the data input signals are delayed by a first signal delay;

delaying a clock signal by the first signal delay, thereby creating a first delayed clock signal;

delaying the clock signal by a variable signal delay, thereby creating a second delayed clock signal;

comparing the first delayed clock signal and the second delayed clock signal;

increasing the variable signal delay when the second delayed clock signal violates a first predetermined relationship with the first delayed clock signal;

decreasing the variable signal delay when the second delayed clock signal violates a second predetermined relationship with the first delayed clock signal; and using the second delayed clock signal to clock the data input signals into the data flip-flops.

16. The method of claim 15 wherein said step of increasing the variable signal delay comprises increasing the variable signal delay when a rising edge of the second delayed clock signal occurs before a rising edge of the first delayed clock signal.

17. The method of claim 16 wherein said step of decreasing the variable signal delay comprises decreasing the variable signal delay when the rising edge of the second delayed clock signal occurs after the rising edge of the first delayed clock signal.

* * * * *